United States Patent
Yokota

[11] Patent Number: 5,369,790
[45] Date of Patent: Nov. 29, 1994

[54] RADIO RECEIVER
[75] Inventor: Yasuhiro Yokota, Kawasaki, Japan
[73] Assignee: Fujitsu Limited, Japan
[21] Appl. No.: 756,585
[22] Filed: Sep. 9, 1991
[30] Foreign Application Priority Data
Sep. 7, 1990 [JP] Japan .................................. 2-237986
[51] Int. Cl.$^5$ .................. H04B 17/02; H04B 1/26; H03L 7/00
[52] U.S. Cl. .................. 455/164.1; 455/258; 455/318; 455/343; 331/2
[58] Field of Search .............. 455/164.1, 164.2, 165.1, 455/137, 166.1, 196.1, 197.1, 208, 209, 258, 259, 265, 313, 314, 315, 323, 324, 343, 275; 331/2, 49; 340/825.44

[56] References Cited
U.S. PATENT DOCUMENTS

| | | | |
|---|---|---|---|
| 3,936,753 | 2/1976 | Clark | 455/164.1 |
| 4,291,414 | 9/1981 | Kimura | 455/164.1 |
| 4,326,294 | 2/1982 | Okamoto et al. | 455/275 |
| 4,727,591 | 2/1988 | Manlowe | 455/164.2 |

Primary Examiner—Reinhard J. Eisenzopf
Assistant Examiner—Lisa Charouel
Attorney, Agent, or Firm—Staas & Halsey

[57] ABSTRACT

A portable receiver provides an output of a local oscillator to a mixer for converting the received signal from an antenna to an intermediate frequency so that the intermediate frequency signal is demodulated. An oscillation generating unit outputs a low frequency signal by switching a plurality of low frequency signals in accordance with a channel designation and a dynamic phase shifter shifts a frequency of the output of the local oscillator before it is input to the mixer, by rotating the phase of the output of the local oscillator using the output signal of the oscillation generator. Therefore, the consumption of the power by this receiver can be decreased.

10 Claims, 16 Drawing Sheets

RADIO RECEIVER

THE BACKGROUND OF THE INVENTION

The present invention relates to a radio receiver, and more particularly to a portable receiver which may be called a pager receiver and in which a plurality of frequencies can be switched.

The pager receiver can be easily carried and thus it is desired to develop a system capable of receiving a radio signal continuously by switching a frequency in any location even if the pager receiver moves to various remote locations in a manner similar to an automobile telephone.

FIG. 1 shows a structure of a portable receiver which has been used and comprises an antenna 1, a mixing unit 2, a local oscillator 3, an intermediate frequency/low frequency processing unit 4, controller 5, and a display portion 6. The output of the local oscillator 3 is provided to a mixing unit 2 to convert a signal received from an antenna 1 to an intermediate frequency signal. The intermediate frequency signal is demodulated by the intermediate frequency/low frequency processing unit 4 and the demodulated signal is displayed on the display portion 6 through the control unit 5.

In order to provide a single oscillation frequency of the local oscillator, this example adapts a zero intermediate frequency system in which the oscillation frequency of the local oscillator 3 is equal to the frequency of the received carrier. In this case, as it is not known whether the frequency modulation component of the received signal appears on the plus side or on the minus side with regard to a carrier frequency, in the mixing unit 2, two mixers receive the signal from a common antenna. A mixer 22 mixes the output of the local oscillator 3 with the received signal and a mixer 21 mixes the output of the local oscillator 3 with the signal whose phase is shifted by $\pi/2$ from the output of the local oscillator 3.

Mixers 21 and 22 output the frequency deviation signal is the input difference component (and the input sum component) and the intermediate frequency/low frequency processing unit 4 demodulates the frequency deviation signal. Control unit 5 receives the demodulated data and determines the data to be displayed, thereby displaying a message from the transmitting side on the display unit 6.

Generally speaking, a crystal oscillator is used for the local oscillator 3 used in a conventional portable receiver. A single crystal oscillator is provided corresponding to a single frequency. When the local oscillator 3 adopts a multi-frequency switching system, that digital synthesizer system of a phase lock loop (PLL) method which is mainly used in a radio receiver provided in a car or in a portable radio receiver is firstly considered.

As shown in FIG. 2, the synthesizer system compares a reference signal obtained from the reference signal generator 11 with a frequency signal channel-designated by a programmable divider 12 in a phase comparator (PD) 13, and the phase difference output from the phase comparator (PD) 13 is applied to the voltage control oscillator (VCO) 15 through a low pass filter 14 so that the control voltage of the voltage control oscillator 15 is controlled, thereby varying. The oscillation frequency of the voltage control oscillator 15. The output of the voltage control oscillator 15 is applied to the programmable divider 12, thereby forming a PLL circuit. Namely the PLL circuit operates so that 1/N (N is equal to a dividing ratio of the programmable divider 12) of the oscillation frequency of the voltage control oscillator 15 becomes equal to the generation frequency generated from the reference signal generator 11. Therefore, the PLL circuit outputs N times the generation frequency of the reference signal generator 11 as the local oscillation output.

Based on this synthesizer system, a pager receiver in which the frequency is switchable can be realized, thereby extremely improving the flexibility of the received frequencies. This synthesizer system is not suitable for a portable receiver that receives signals intermittently because power consumption increases with the speed of the operation and it takes time to start-up the receiver. This is because a certain time is required for the PLL circuit to output the same frequency signal as the frequency of the reference signal generator 11. Further, the digital synthesizer has difficulty in operating at low voltages because it uses a digital divider.

On the other hand, in the conventional analog oscillator, shown in FIG. 3, i (i=1 to n) channels contain a crystal oscillator $X_i$, diode $D_i$ and an input resistor $R_i$, respectively. A voltage is applied to an input resistor of the designated channel, the other terminal of the corresponding crystal oscillator is grounded and thus the oscillator 3 oscillates at the frequency of the crystal oscillator $X_i$. The oscillator 3 can sufficiently operate even at a low voltage but it requires many crystal oscillators, thereby increasing the cost of the analog oscillator and occupying a relatively larger space.

A SUMMARY OF INVENTION

An object of the present invention is to provide a radio receiver in which an output of a local oscillator is provided to a mixer to convert the signal received from the antenna to the intermediated frequency signal. The received signal is demodulated by an intermediate frequency/low frequency processing unit and the demodulated signal is displayed on the display unit through a control unit, thereby enabling a plurality of frequencies to be selectively received in a small configuration and at a low consumption of the power.

A feature of the present invention resides in a portable receiver operated by a battery comprising a first oscillator; a second oscillator for outputting signal of a lower frequency than the frequency of the first oscillator; first mixer means for adding an output from the first oscillator to a signal obtained by shifting the output frequency of the second oscillator by $\pi/2$; second mixing means for adding a signal obtained by shifting the output frequency of the first oscillator by $\pi/2$ to the output of the second oscillator; and a combining means for combining an output of the first mixing means with the output of the second mixing means thereby providing an output of a local oscillator.

DESCRIPTION OF THE EMBODIMENT

Figure 4:
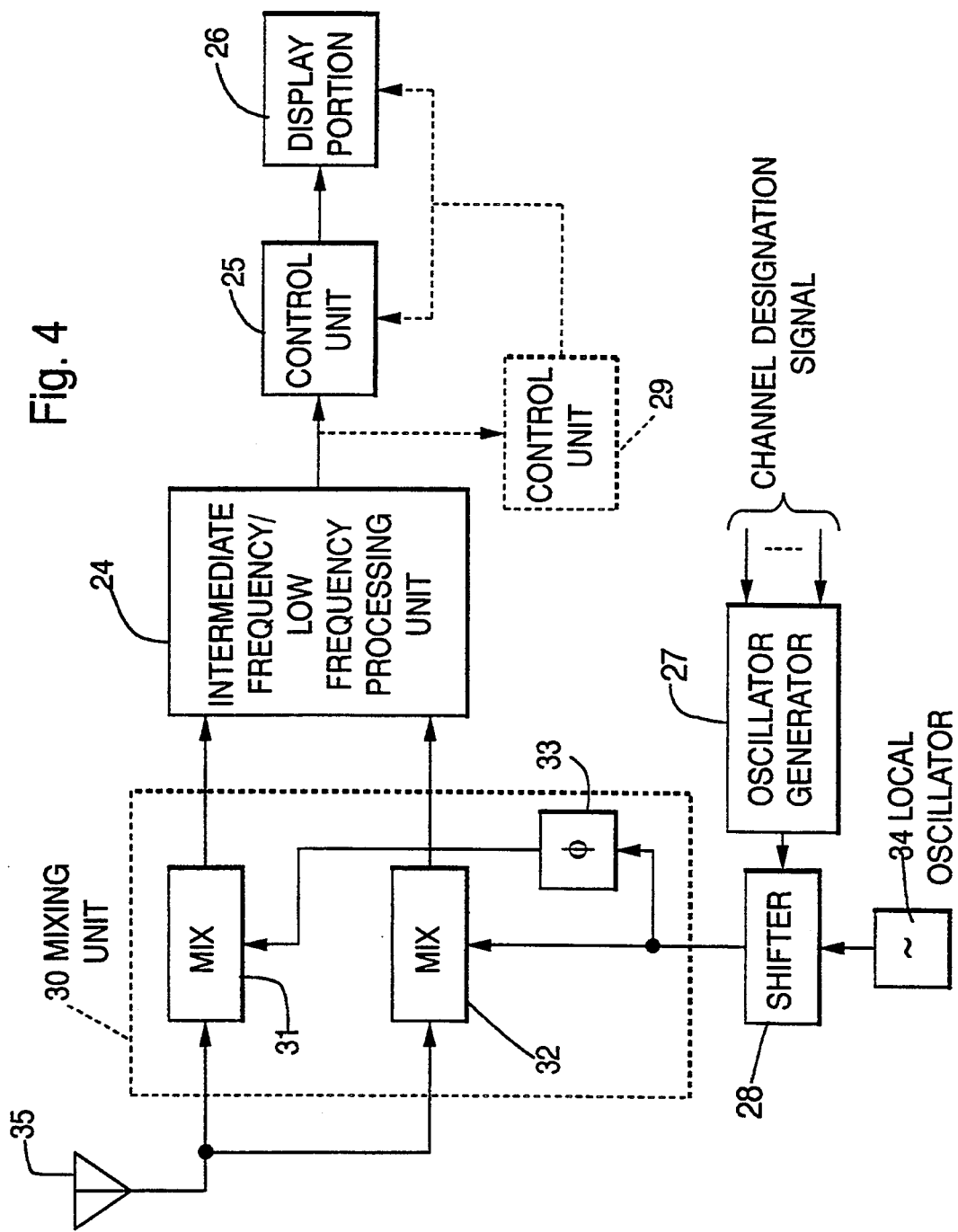
FIG. 4 is a block diagram of a first embodiment of a portable receiver according to the present invention.

FIG. 4 is a block diagram of a first embodiment according to the present invention.

The portable receiver of the present invention comprises an oscillation generator 27 for switching and outputting a plurality of low frequency signals in accordance with a channel designation signal. A dynamic phase shifter 28 frequency-shifts the output of a local oscillator 34 by rotating the output of the local oscillator 34 in accordance with the output signal from the oscillation generator 27.

The dynamic phase shifter 28 performs a dynamic phase shifting operation by keeping a change of the phase with time constant, i.e., by changing the frequency. In contrast, the phase shifter performs a static phase shifting operation by shifting the phase by $\pi/2$, for example.

As shown in the dashed line in FIG. 4, the present invention further provides an intermittent receiving control unit 29 for judging whether the output of the intermediate frequency/low frequency processing unit 24 is transmitted to a self-station and energizes the control unit 25 and display unit 26 only when the signal addressed to the self-station is received.

The mixing unit 30 comprises two mixers 31 and 32 for receiving the common signal from an antenna 35 and a dynamic phase shifter 28. The mixer 32 mixes the received signal and the output of the dynamic phase shifter 28, and the mixer 31 mixes the received signal and the output of shifter 33 which shifts the output of dynamic phase shifter 28 by $\pi/2$.

In FIG. 4, the oscillating unit 27 receives the channel designation signal and selects any one of a plurality of low frequency signals to be selectively output to the dynamic phase shifter 28.

The dynamic phase shifter 28 shifts a frequency of the output of the local oscillator 34 based on the low frequency output signal from the oscillation generator 27.

That is, the phase of the output from the local oscillator 34 is rotated by the dynamic phase shifter 28 in accordance with the output from the oscillation genera-tor 27 and provides a desired frequency signal to the mixing unit 30 by utilizing the principle that the frequency increases with the advance of the phase and the frequency decreases with the delay (this is called single side band (SSB) and is discussed later). Accordingly, a plurality of low frequency signals are assigned to the radio range, a plurality of frequencies can be switched by using a low power consumption at a low frequency.

In the present invention, usually, the power of the control unit 25 is turned off and the intermittent control unit 29 always observes a demodulated output from an intermediate frequency/low frequency processing unit 24. When the demodulated output is a received signal addressed to the self-station, the power of the control unit 25 is turned on, thereby displaying the message and saving the power always consumed in control unit 25. Further, according to this invention, if the mixing unit 30 comprises two mixers 31 and 32 and a $\pi/2$ phase shifter 33 as shown in FIG. 4, then the zero intermediate frequency receiving system in which a single local oscillator 34 is used can be provided.

Figure 5:
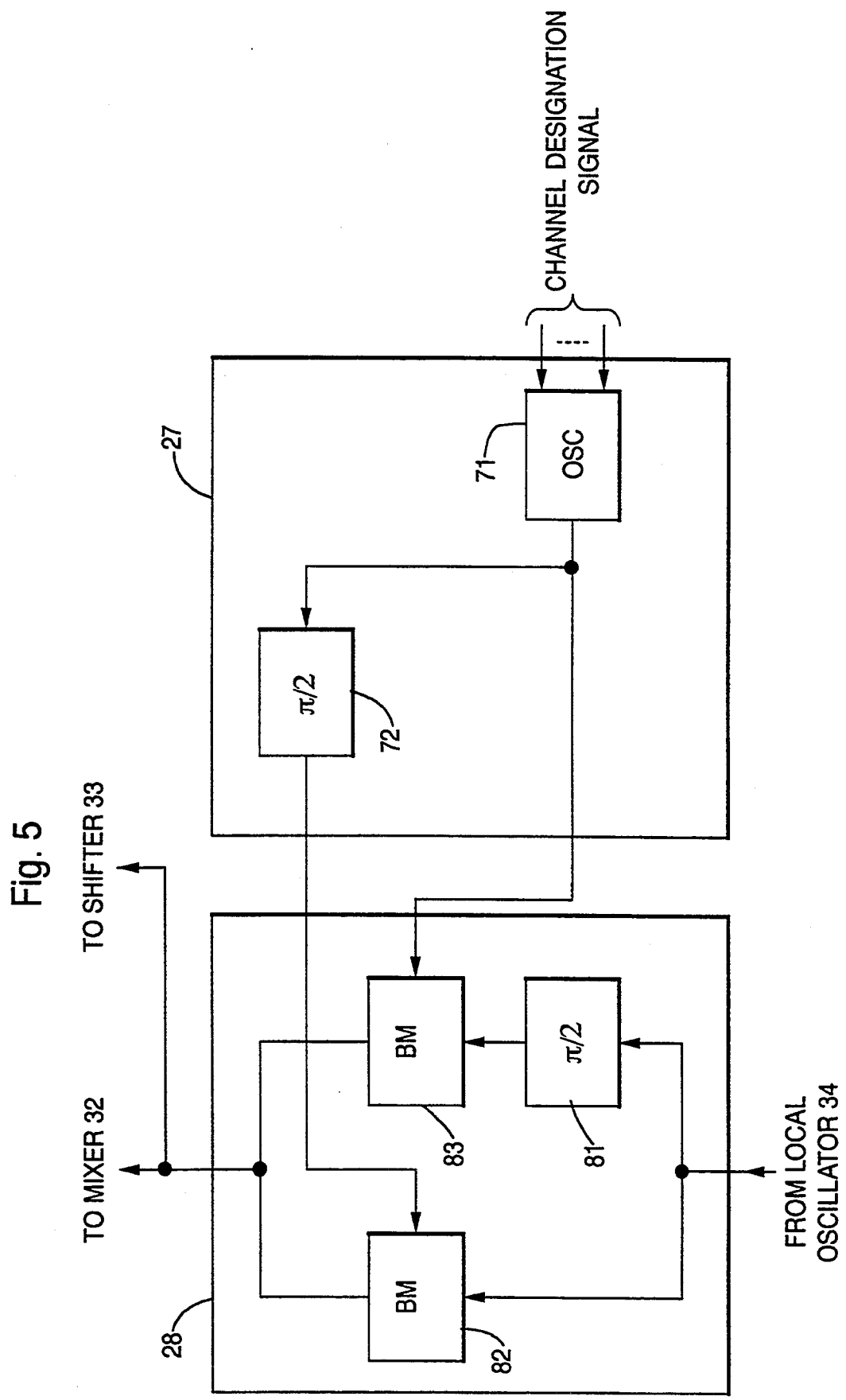
FIG. 5 is a block diagram of an embodiment of an oscillator and dynamic phase shifter used in the portable receiver according to the present invention.

FIG. 5 designates an embodiment of an oscillation generator 27 and the dynamic phase shifter 28 shown in FIG. 4 and used in the portable receiver. The oscillation generator 27 comprises an oscillator 77 for selecting one frequency out of a plurality of frequencies with an interval of 25 KHz (for example) and a phase shifter 72 for shifting the phase of the output signal from oscillator 77 by $\pi/2$. The dynamic phase shifter 28 comprises a phase shifter 81 for changing the phase of the output signal from the local oscillator 34 by $\pi/2$, a balanced modulator (BM) 82 for modulating the output signal of the local oscillator 34 by the output Lf1 from the phase shifter 72 in the oscillation generator 27, and a balanced modulator 83 for modulating the output signal of phase shifter 81 by a channel frequency signal Lf2 from the oscillator 71 in the oscillation generating unit 27.

Both output signals of balanced modulator 82 and 83 are combined and provided to the mixer 32 and phase shifter 33 shown in FIG. 4 as a single output signal. The phase shifter 72 in the oscillation generator 27 may be provided in the dynamic phase shifter 28. In this case, the output signal of the oscillator 71 is directly applied to the balanced modulator 83 and the output signal of the oscillator 71 is shifted by $\pi/2$ by the phase shifter 72 provided in dynamic phase shifter 28, and thereby being applied to the modulator 82.

Operation of the embodiment shown in FIG. 5 comprises an application of the modulating circuit of the well-known single side band (SSB). For example, when the output signal of the oscillator 71 and a rotation of the phase for increasing the phase at a speed of 25 KHz by phase shifter 72 are applied to the output signal of 150 MHz from the local oscillator 34, then the combined output signal from the phase shifter 28 becomes 150.025 MHz on the upper side band wave.

Conversely, when the phase of the dynamic phase shifter 72 is caused to change by $-\pi/2$, the rotation of the phase in which the phase is delayed at the speed of 25 KHz is provided by the dynamic phase shifter 72 and thus the combined output signal from the dynamic phase shifter 28 becomes 149.975 MHz on the lower side band wave.

For example, as stated above, the output frequency of the local oscillator 34 is $\alpha$ and the output of the frequency of the oscillator 71 is $\beta$, and one of the input signals of the balanced modulator 82 and 83 are expressed by $\sin \alpha t$ and $\cos \alpha t$ and the other of the input signal is expressed by sin βt, and −cosβt. Then the respective output 082 and 083 becomes as follow;

$$
\begin{aligned}
O82 &= \sin\alpha t \times \sin\beta t \\
&= (-\cos(\alpha + \beta)t + \cos(\alpha - \beta)t)/2 \\
O83 &= -\cos\alpha t \times \cos\beta t \\
&= -(\cos(\alpha + \beta)t - \cos(\alpha - \beta)t)/2
\end{aligned}
$$

By combining the output of the balanced modulators 82 and 83, the frequency of the sum of the output of −cos (α+β)t is provided.

Further, the phase shifter 72 performs shifting of −π/2, the other input signal becomes sin βt, cosβt and the output 082 is the same as described above and the output 083 is as follows;

$$
\begin{aligned}
O83 &= \cos\alpha t \times (-\cos\beta t) \\
&= (-\cos(\alpha + \beta)t + \cos(\alpha - \beta)t)/2
\end{aligned}
$$

By combining the outputs from the balanced modulator 82 and 83, a frequency signal of the sum cos (α−β)t can be obtained.

Figure 6:
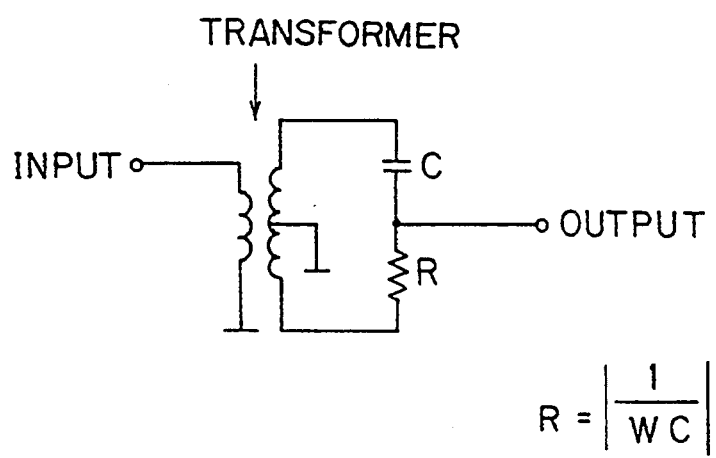
FIG. 6 is a circuit diagram of a phase shifter circuit used in the embodiment of the present invention.

FIG. 6 shows the detailed structure of the phase shifter 81. The phase shifter shown in FIG. 6 forms 0 phase and π phase in correspondence with the input signal by using the transformer Trs with one terminal of the transformer connected to capacitor C and the other terminal of the transformer connected to resistor R. An intermediate point between the capacitor C and the resistor R is connected to an output terminal. This circuit shown in FIG. 6 provides the output of π/2 or −π/2.

Figure 7:
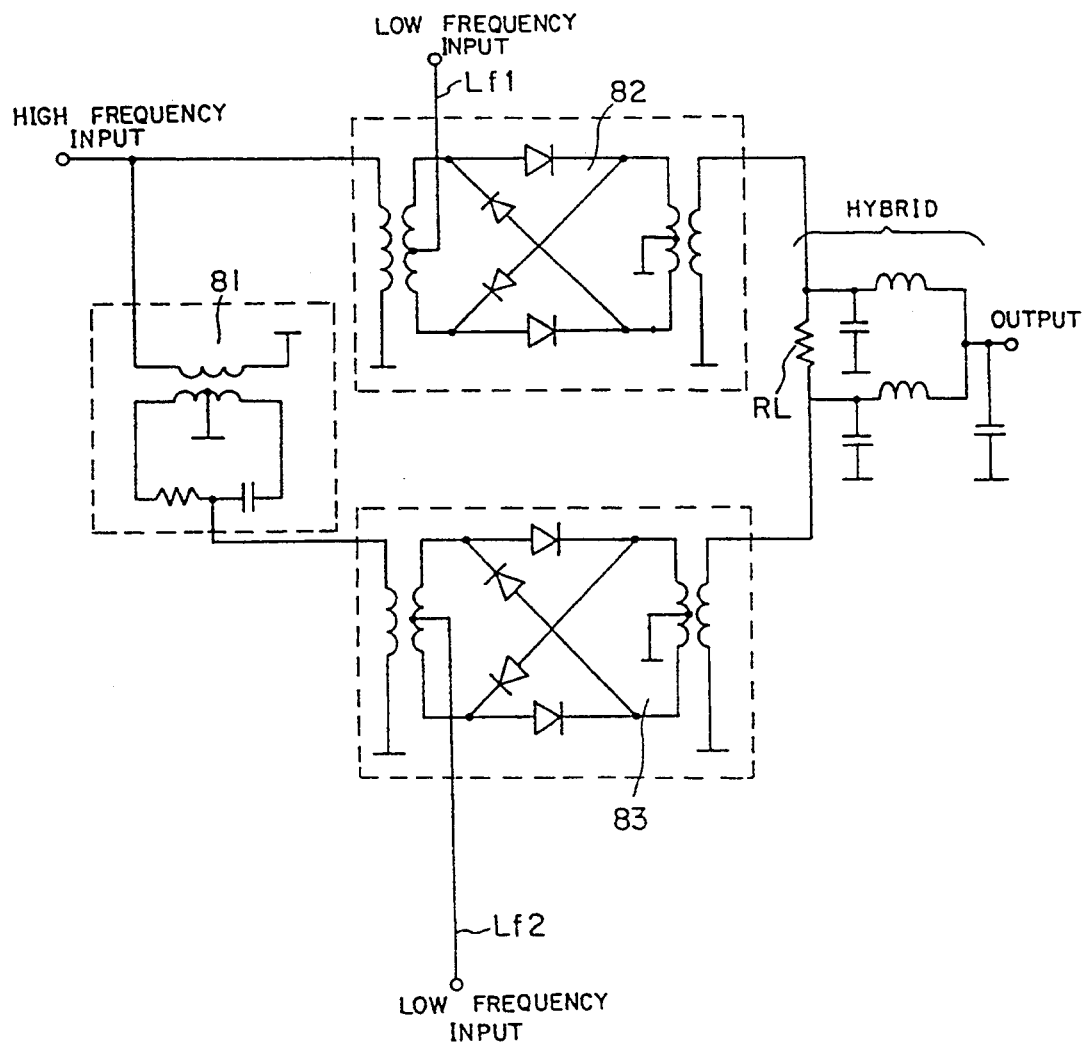
FIG. 7 is a circuit diagram of a dynamic phase shifter used in the embodiment of the present invention.

FIG. 7 shows a detailed structure of the dynamic phase shifter 28 using the phase shifter shown in FIG. 6. A high frequency signal output from the local oscillator 34 is added to the balanced modulator 82 and is added to the balanced modulator 83 through the above described phase shifter 81. The balanced modulator 82 and 83 comprising a ring modulator comprises a transformer in an input stage, a four diode bridge configuration and a transformer at the output stage. The outputs Lf1 and Lf2 of the oscillation generator 27 are added to the balance modulator 82 and 83. The balance modulator 82 and 83 output the difference between the output frequency from the local oscillator 34 and the output signal frequency from the oscillation generator 27 ( low frequency output) and the sum frequency signal.

These difference and sum frequency signals are input to a hybrid circuit HB 84 and are added therein. As shown in the previous equation, this sum operation cancels one of the frequency signals (the difference or sum) which is combined and either of the difference frequency signal or sum frequency signal is output from the output terminal.

The hybrid HB 84 has a terminating resistor RL and the terminals of the resistor RL are connected to the balanced modulator 82 and 83, respectively to close the line, and are connected to the output terminal through the L type circuit of the LC ,circuit. The output terminal is grounded through a capacitor. The hybrid circuit HB 84 forms a low pass filter LPF for deleting a high frequency component out of the band. When a high frequency component is small , or when the high frequency component does not affect the function of the receiver even if it exits, the hybrid circuit HB 84 can be omitted.

Figure 8:
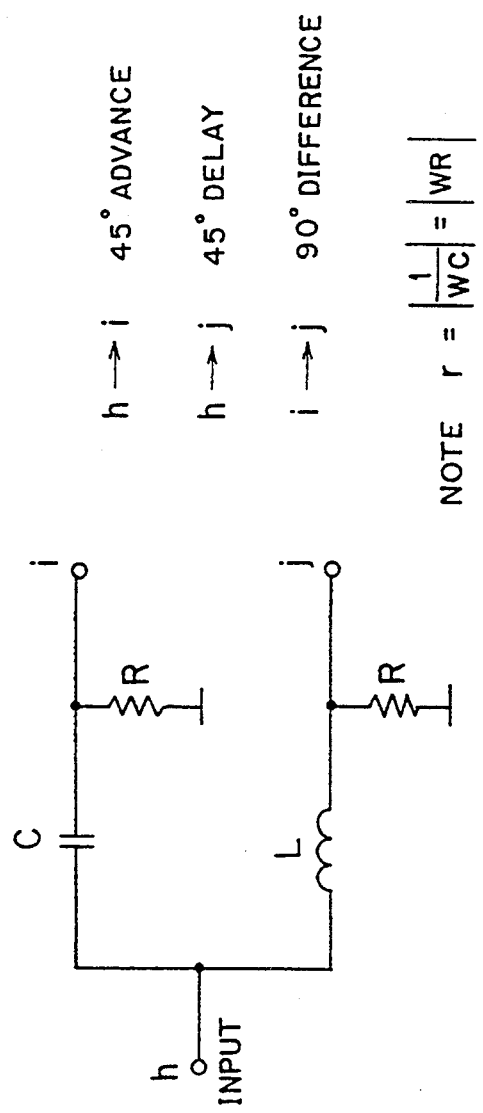
FIG. 8 is another circuit diagram of a phase shifter used in the embodiment.
Figure 9:
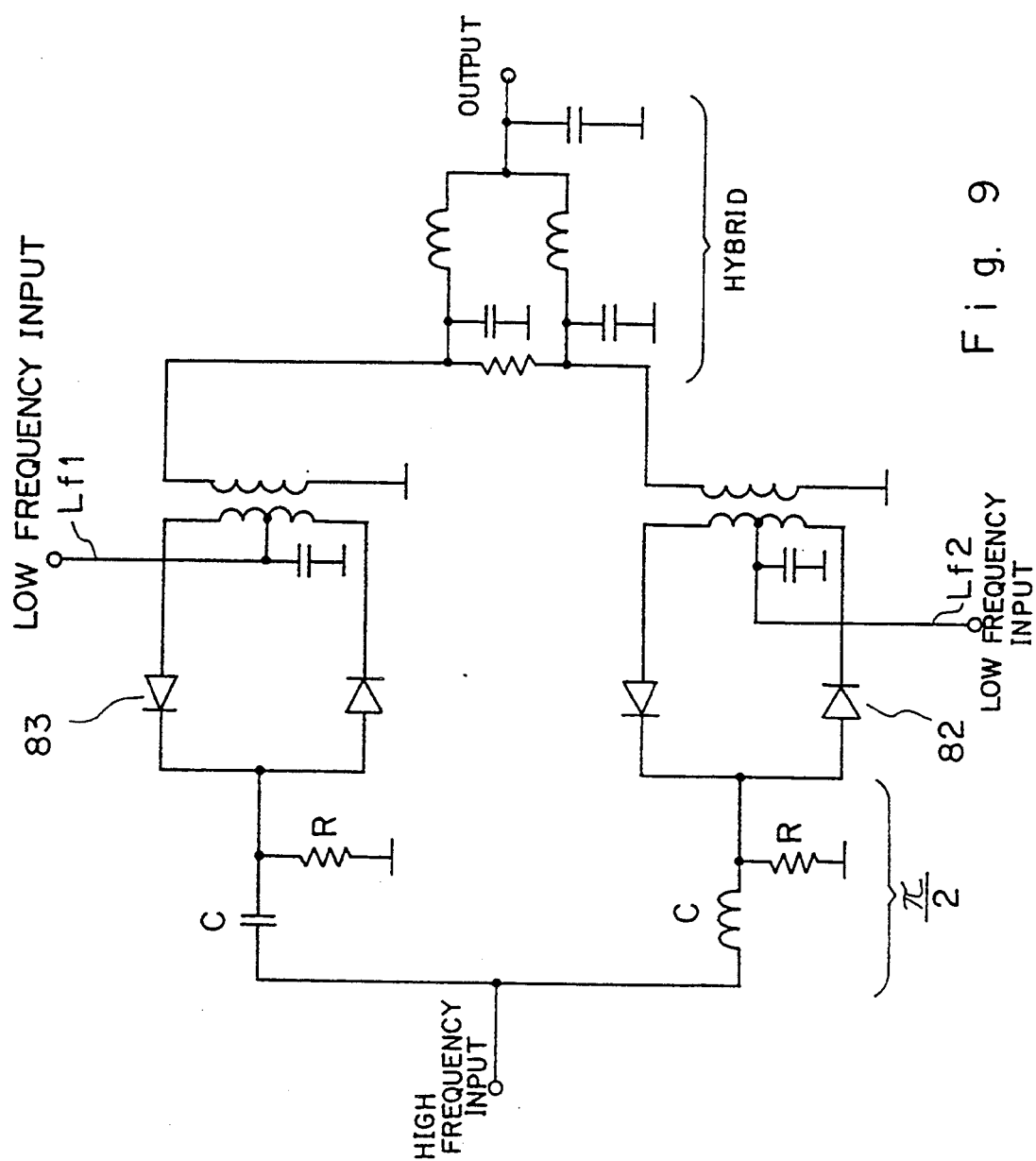
FIG. 9 is another circuit diagram of the phase shifter used in the embodiment of the present invention.

In the embodiment shown in FIGS. 4, 5, and 7 , the dynamic phase shifter 28 shifts one of the phase by π/2 by using the phase shifter 81. The present invention is not limited to this construction. For example, as shown FIG. 8, a phase shifter (CR) comprising a capacitor C and a resistor R is provided on one side and a phase shifter (LR) comprising an induction L and a resistor R is provided on the other side. The phase shifter on the one side is advanced by 45 degrees and the phase shifter on the other side is delayed by 45 degrees, thereby enabling the phase difference between i−j to be 90 degrees and forming the dynamic phase shifter. As shown in FIG. 9, a phase difference of 90 degrees is provided by using CR and LR and at a later stage a mixer of the non-balance type may combine the two signals. The phase shifter comprising CR or LR has the value r of a respective resistor R as follows.

$$r = 1/\omega C = \omega l$$

Figure 10:
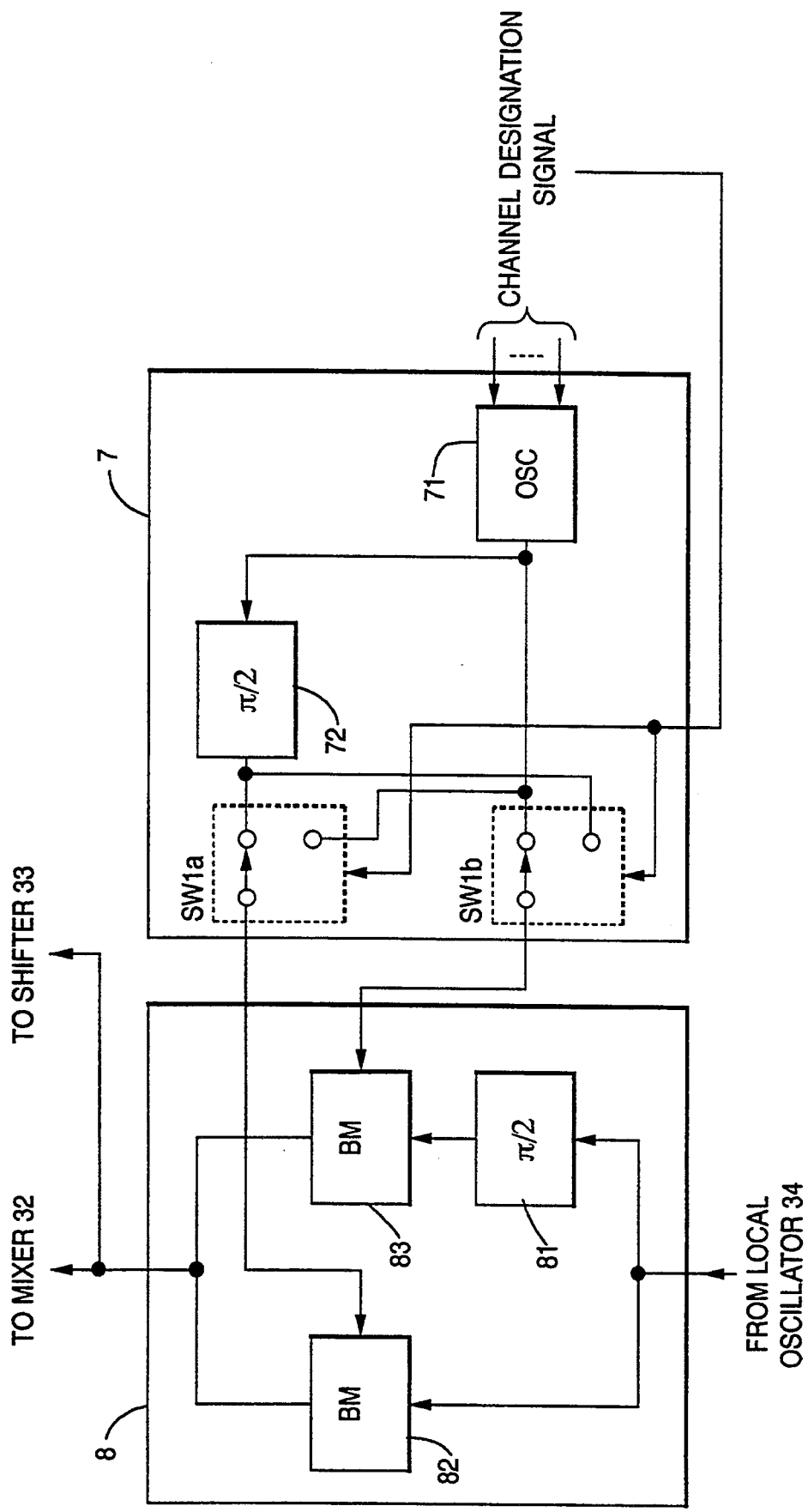
FIG. 10 is a block diagram of a second embodiment of the oscillator and dynamic phase shifter used in the portable receiver according to the present invention.

FIG. 10 shows another embodiment of the oscillation generator 27 capable of changing the phase rotation. The embodiment shown in FIG. 10 is different from FIG. 5 in that switches SW1a and SW1b are provided and a switching signal is added to the switches as the channel designation signal, the phases applied to the balance modulators 82 and 83 are reversed and the phase shift is changed to the plus side or the minus side.

Figure 11:
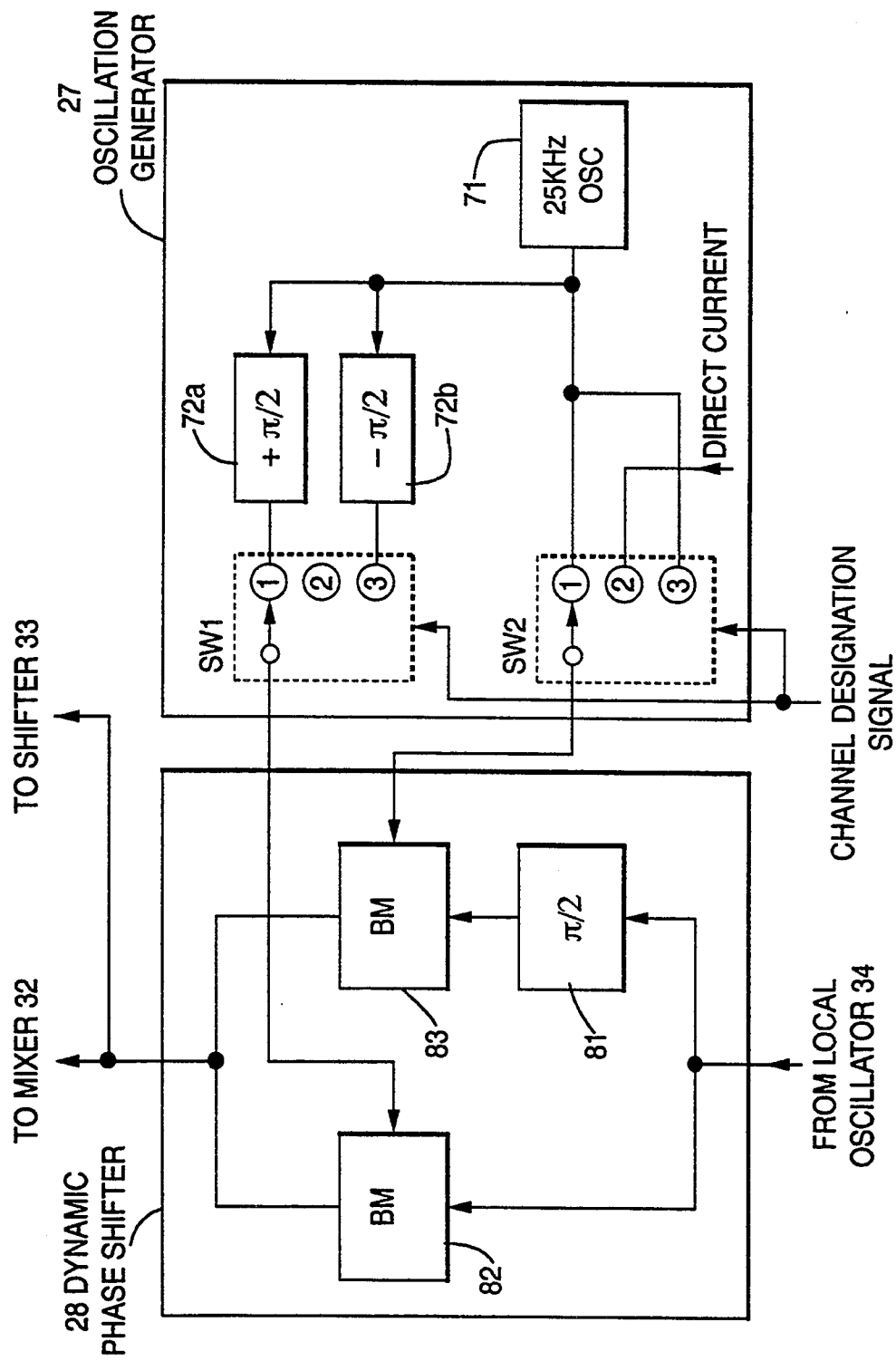
FIG. 11 is a block diagram of a third embodiment of an oscillator and phase shifter used in the portable receiver according to the present invention.

FIG. 11 shows a further embodiment of the oscillation generator 27 and the dynamic phase shifter 28. In this embodiment, two position switches SW1 and SW2 are provided and switch in accordance with the channel designation signal. The output of the 25 KHz oscillator 71 is provided to a switching point ① as a the first switching point ① of the switch SW1 by the phase shifter 72a and is provided to the third switching point ③ of the switch SW1 by −π/2 phase shifter 72b. In this case, nothing is connected to the second switching point ② of the switch SW1. The first and third switching point ① and ③ of the switch SW2 are connected to the oscillator 71 and a direct current is always provided to the second switching point ②.

When the channel designating signal selects the first switching point ① of the switch SW1 and SW2 in the oscillation generator 27, then the structure becomes the same as in FIG. 5. When the channel designation signal selects the third switching point ③, then the oscillation generator 27 performs the reversed phase rotation as compared with the rotation in FIG. 5. When the channel designating the signal selects the dynamic phase shifter 28 does not perform the balance modulation operation then the output signal of the local oscillator 34 is applied to the mixing unit 30 without being modified.

Accordingly, the frequency generator 27 shown in FIG. 11 provides the frequency of the oscillator 71 and upper and lower frequencies apart from the frequency of the oscillator 71 by the channel interval which comprises 25 KHz, thereby providing three low frequency signals.

Figure 1:
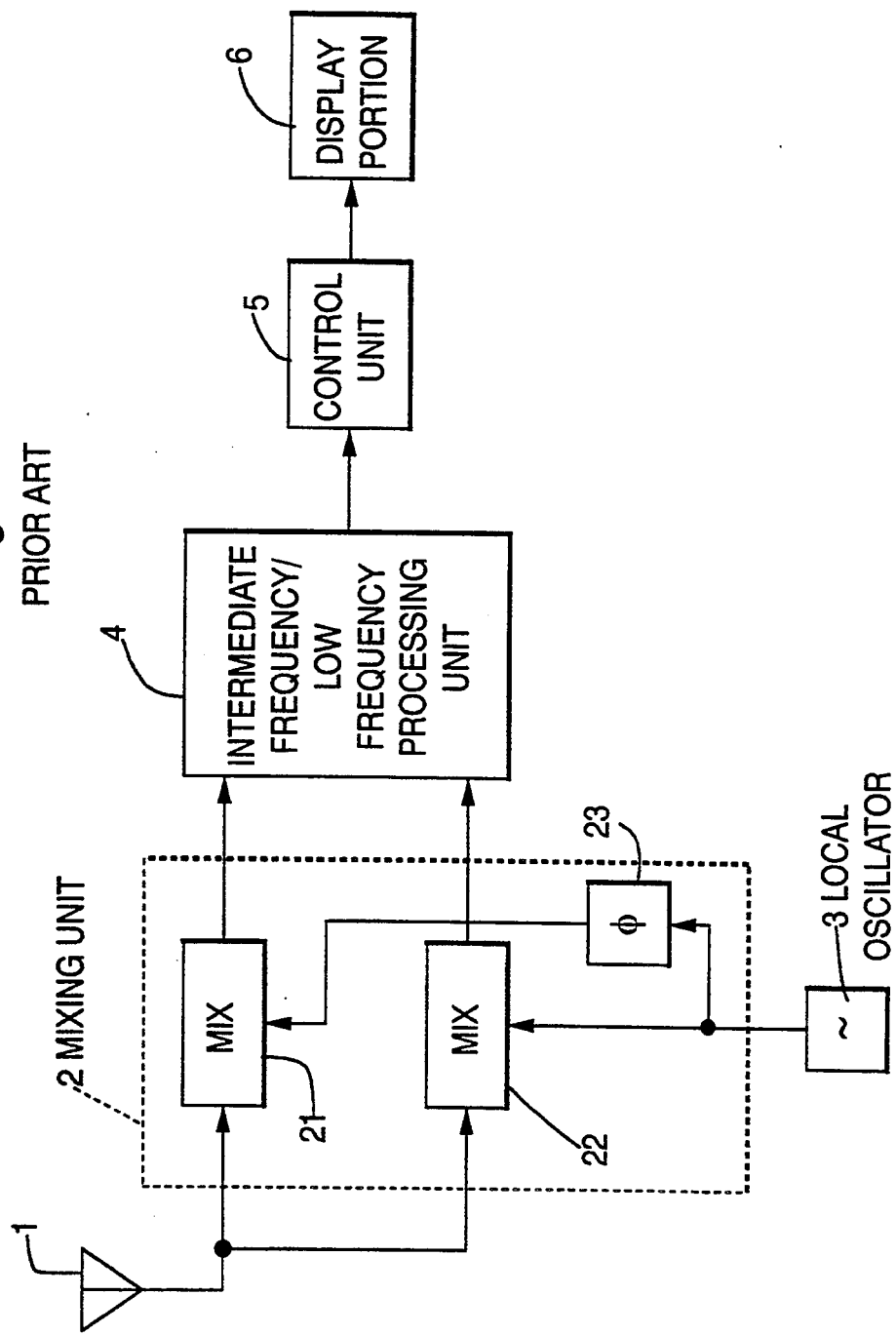
FIG. 1 is a block diagram designating an example of a structure of a conventional portable receiver.
Figure 2:
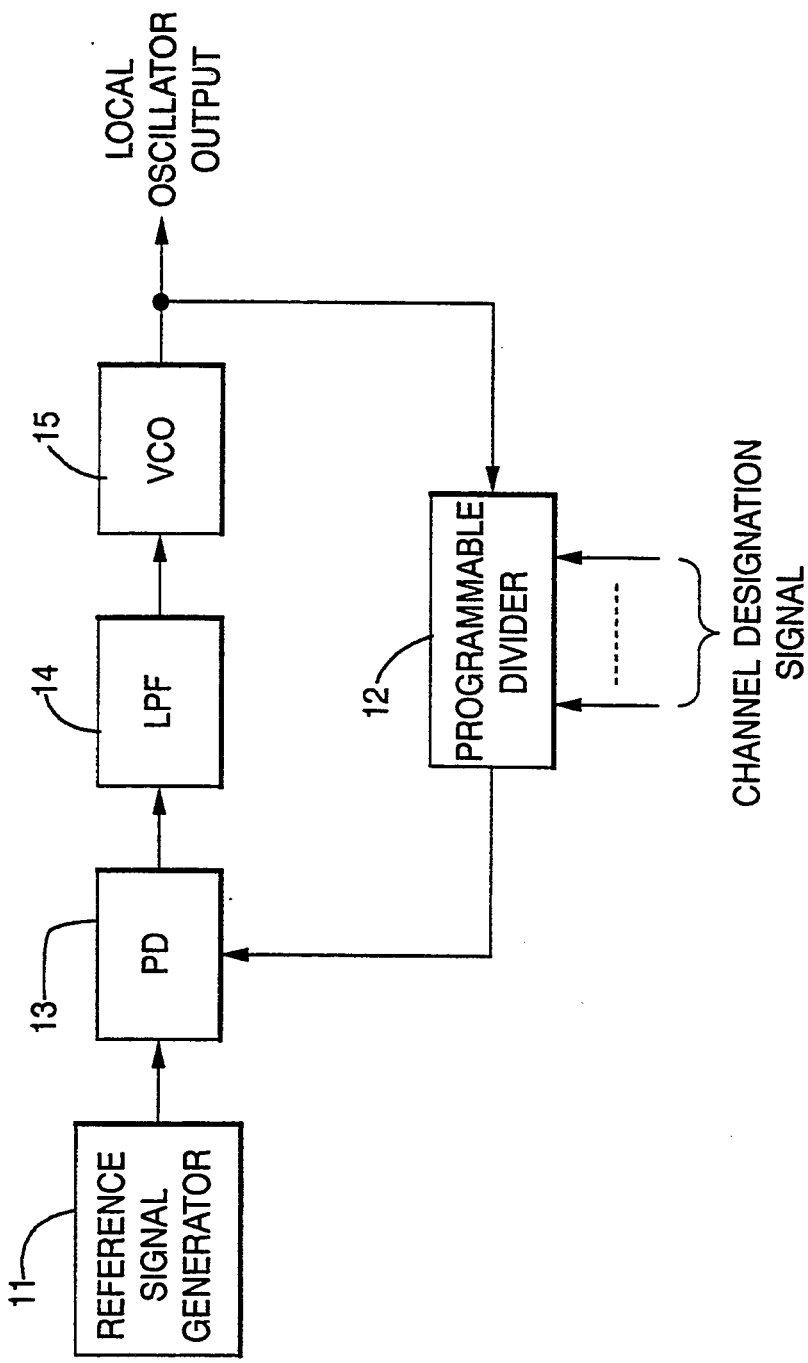
FIG. 2 is a block diagram of a local oscillator used in a phase lock loop synthesize method.
Figure 3:
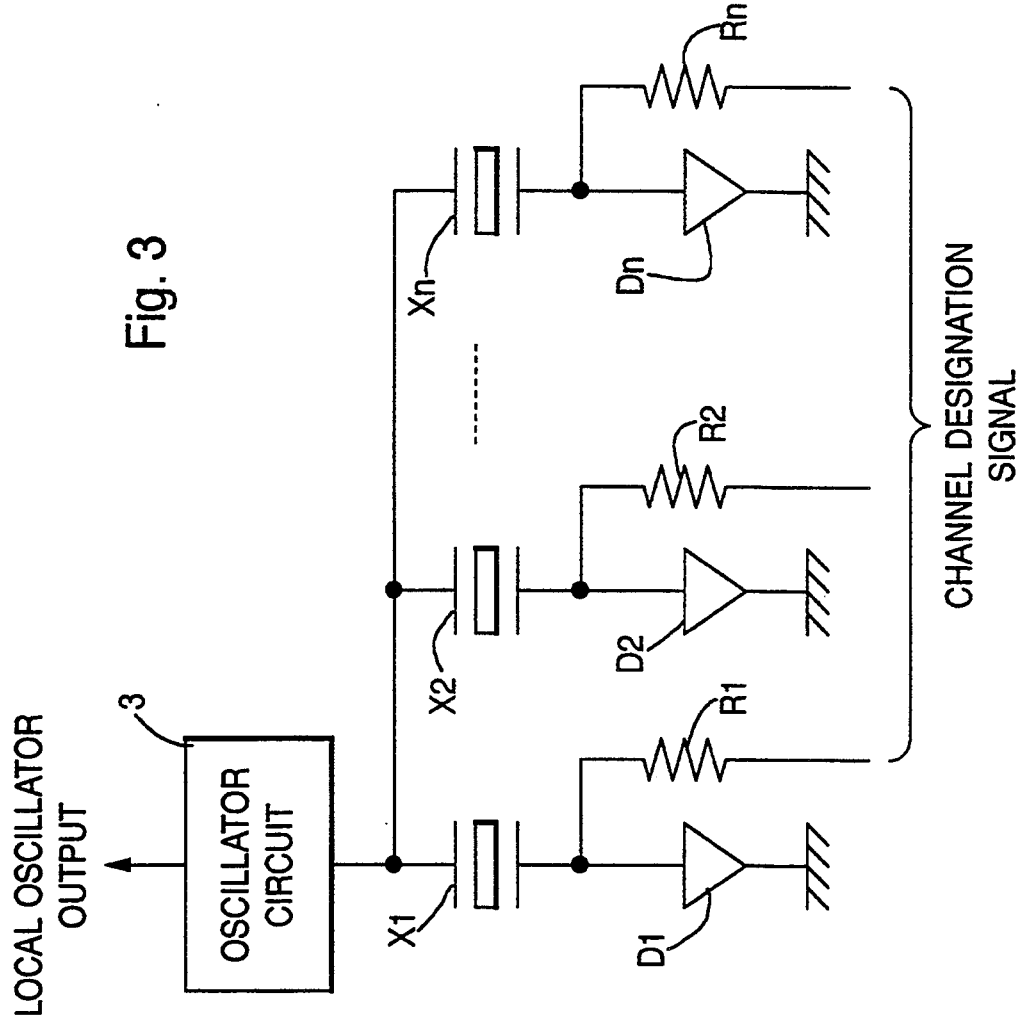
FIG. 3 is a circuit diagram of a prior art local oscillator used in a crystal oscillator switching method.

In the above embodiment, the mixing unit 30 shown in FIG. 4 can be used when a single mixer is used or when two mixers 21 and 22 as in the conventional intermediate frequency receiving method shown in FIG. 1 are used.

The channel designation signal for the oscillation generator 21 may be applied manually and the designation signal for switching the channel may be applied to the oscillation generator 7 appropriately in accordance with the level of the demodulated output from the intermediate low frequency processing unit 24.

Figure 12:
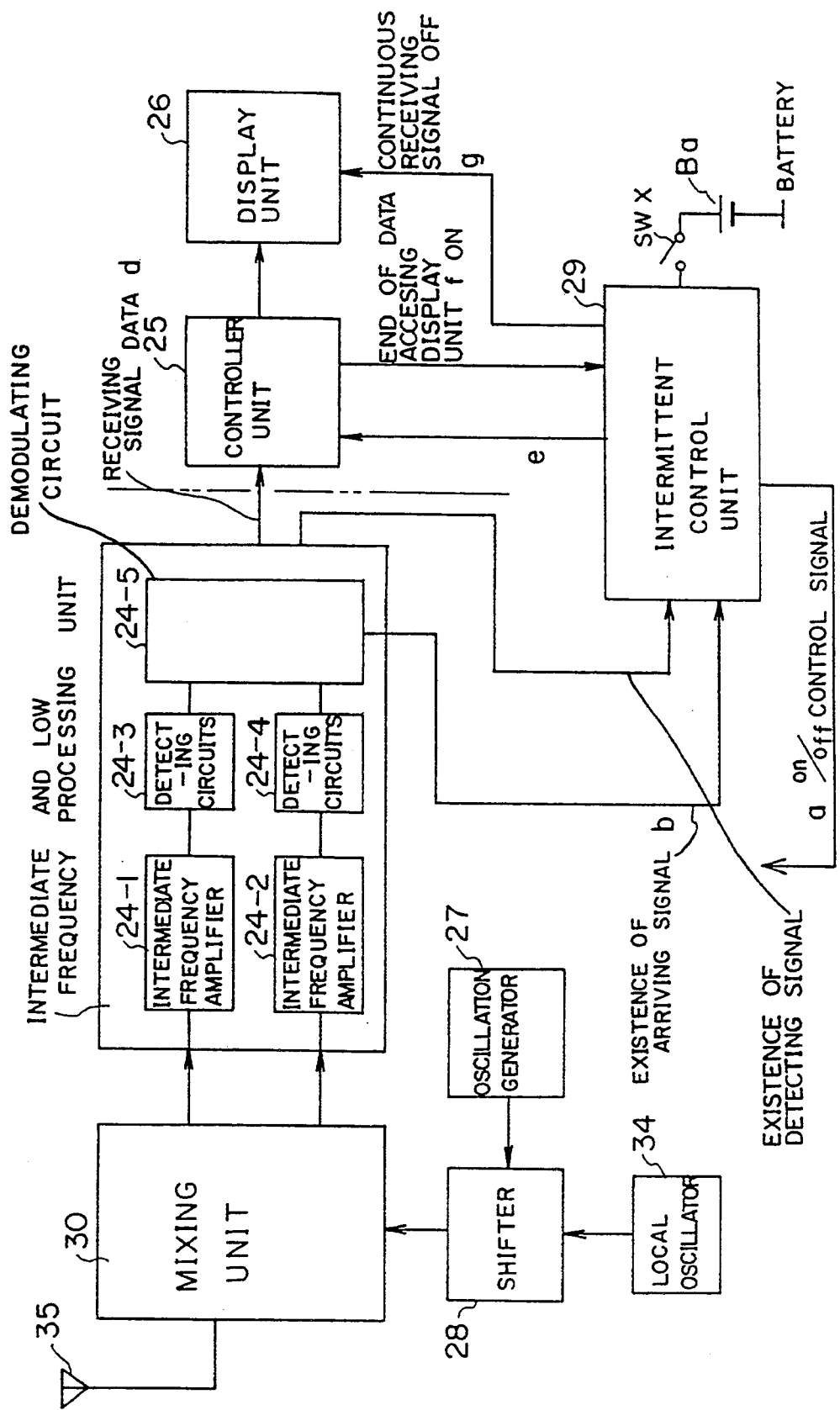
FIG. 12 is a block diagram of an embodiment of the intermittent control.

FIG. 12 shows a structure of an embodiment according to an intermittent control.

The signal subjected to the frequency conversion at the above described mixing unit 30, namely, the intermediate frequency signal is applied to the intermediate frequency/low frequency processing unit 24. It is not known that the mixers 31 and 32 in the mixing unit 30 have the frequency modulation component of the received signal on the plus side or on the minus side with regard to .the carrier frequency. Thus, two mixers 31 and 32 are provided to correspond to both the plus side and the minus side. The output of the mixers 31 and 32 are applied to the intermediate frequency amplifiers 24-1 and 24-2 to be amplified. The detecting circuits 24-3 and 24-4 detect the amplified signal and input it to the demodulating circuit 24-5 so that it is demodulated.

Demodulating circuit 24-5 outputs a signal b representing an existence of the arriving signal, ID detecting signal c and received data d.

An on /off control signal a of the intermittent control unit 29 is added to and controls the local oscillator 34 , the dynamic phase shifter 28, oscillation generator 27, mixing unit 30, and intermediate frequency/low frequency processing unit 24.

When the on/off control signal a designates the operation, the receiver starts the receiving operation. The intermittent receiving operation period is about several seconds. When the received signal is not received during this intermittent receiving operation period, the on/off control signal (off) is output to make the receiver inoperative after the predetermined on-period. The on/off control signal is an output of a switch which is connected to a power source during an on period.

On the other hand, when, during the predetermined on period, a received signal is received, the demodulating circuit 24-5 outputs signal b representing the existence of the arriving signal and the receiver determines whether the self ID signal exists in the received signal. When the self ID signal is not received, the on/off control signal is turned off. When the self ID signal is received, the power source turns on to provide a control signal e for the control unit 25.

When the power is on, a control unit 25 accepts the received data d from the intermediate frequency/low frequency processing unit 24. When the receipt of the received signal is completed, the completion-of data-reception signal f is output to the intermittent control unit 29 and intermittent control unit 29 operates the display unit 26 by using the control signal g, thereby performing a display in units of one page. This control signal e and control signal g are the output of the switch which is connected to the power source during an on operation, in the same manner as the on/off control signal a.

After a display for the predetermined time period, the display operation is stopped.

In the embodiment shown in FIG. 12, the battery Ba is connected to the intermittent control unit 29 through a switch SWX and when the switch SWX is on, the intermittent control unit 29 controls a power to be supplied to all the circuit.

Figure 13:
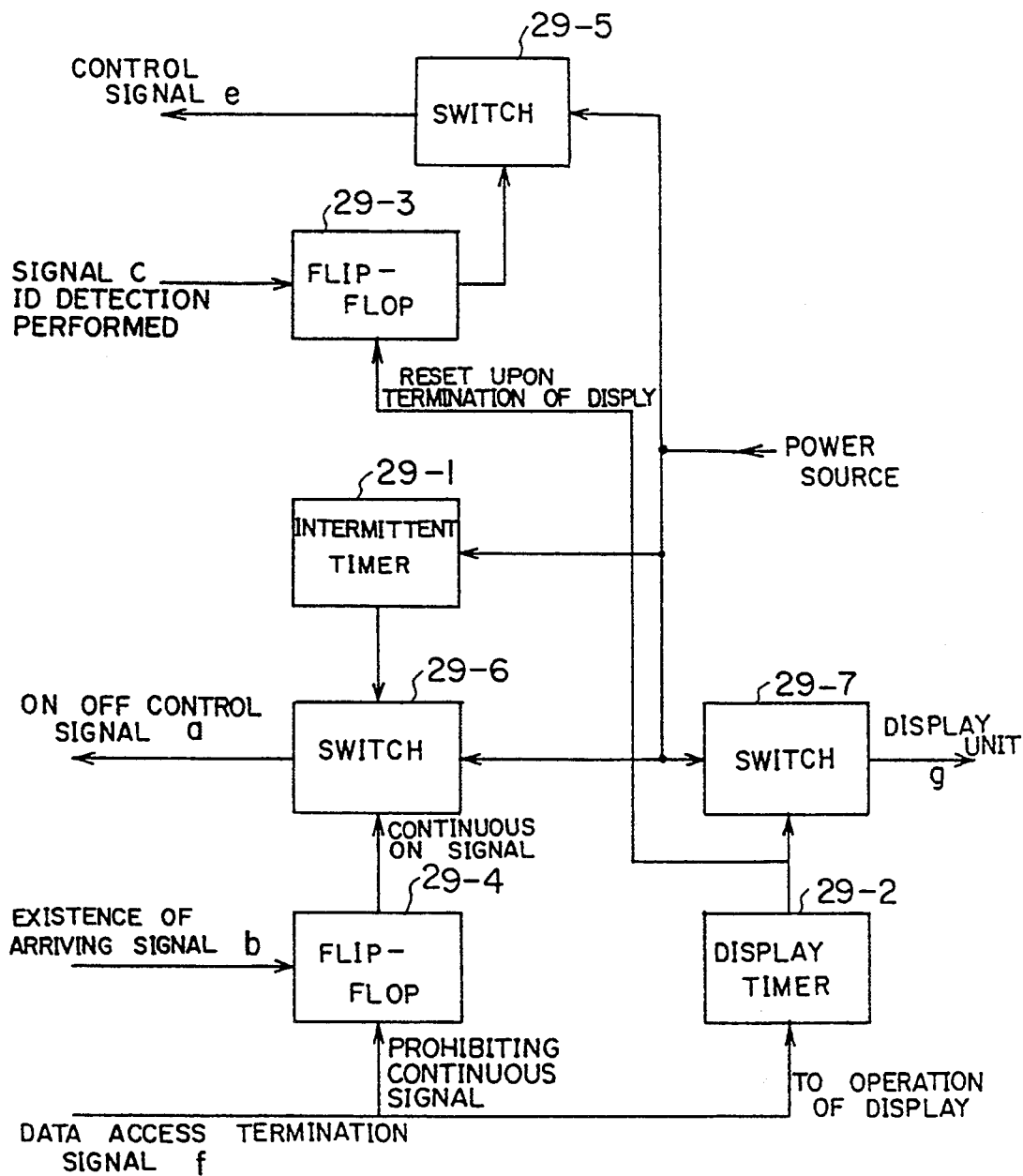
FIG. 13 is a block diagram of an embodiment of the intermittent control unit in FIG. 12.

FIG. 13 is a block diagram of a structure of an intermittent control circuit of the embodiment according to the present invention. The intermittent control unit 29 comprises an intermittent timer 29 performing an intermittent operation control, a display timer 29-2 for the display time set reset flip-flop 29-3 and 29-4, and the switches (SW) 29-5, 29-6, and 29-7 for connecting one terminal to the power and the other terminal to the power terminal of respective circuits.

Figure 14:
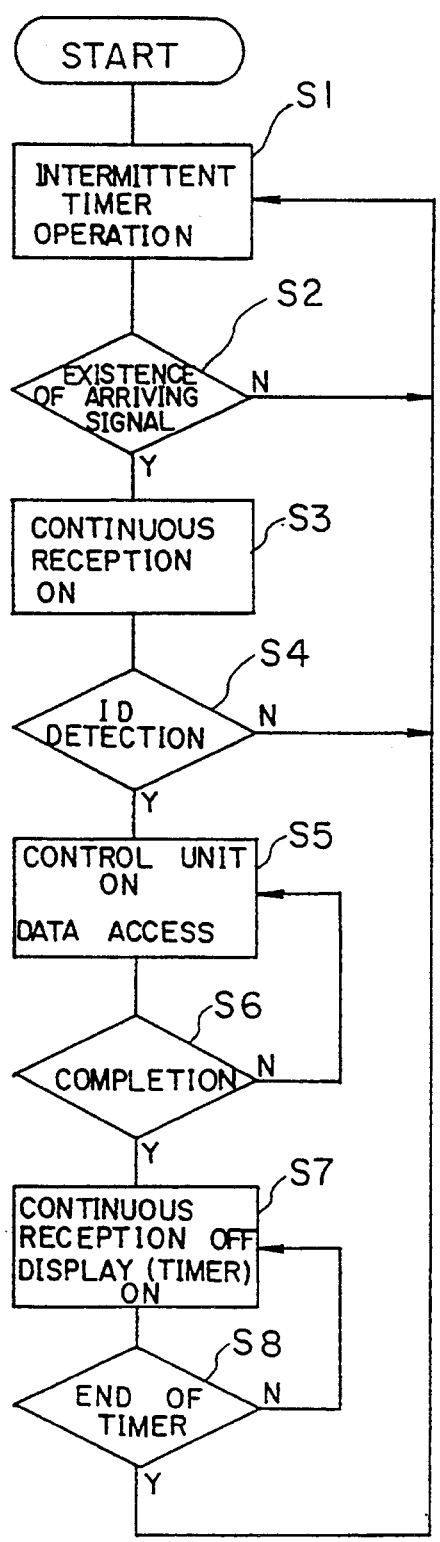
FIG. 14 is a flow chart of the intermittent control portion according to the present invention.
Figure 15:
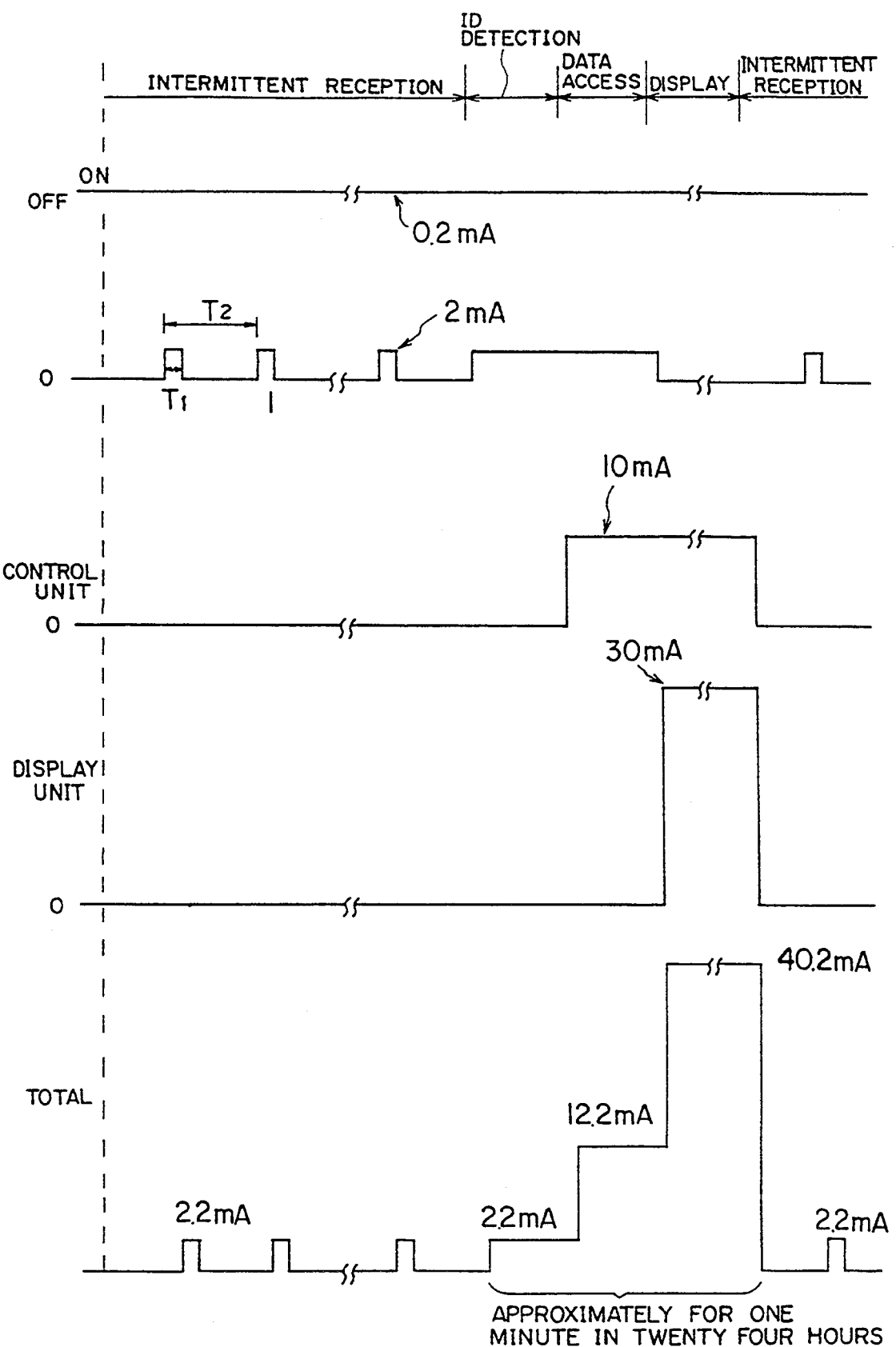
FIG. 15 is a timing chart of the intermittent control.

FIG. 14 shows an operation of a flowchart of the intermittent control unit of an embodiment of the present . invention, FIG. 15 designates an operation timing chart. When the power is on, the intermittent timer 29-1 starts the operation at step S1. When the operation starts, the intermittent timer 29-1 turns on the switch 29-6 to output an on/off control signal. This on/off control signal enables power to be supplied to a local oscillator 34, oscillation generator 27, and intermediate frequency/low frequency processing unit 24 for time T1 in units of a predetermined unit time T2. Power is supplied to the dynamic phase shifter 28 and mixing unit 30 depending on the system configuration.

When the receiving operation is not performed at all, the system remains in a waiting condition; only a current operating the intermittent control unit 29, for example 0.2 mA flows. During the receiving period, 2 mA flows. That is, in total 2.2 mA flows. When the intermittent timer is on, a receiving operation is performed. When any signal is not received, the arriving signal b is not input and flip-flop 29-4 is kept reset. That is, step S2 designates no receiving signal (N) and the intermittent timer operation is returned to the start S. This state represents that there is no message to respective receivers transmitted from the transmitting station.

When the message exists, the receiving data exists and the process advances to state S3. At this time, the receiving signal b designating the existence of the receiving signal is applied to the receiver to set the flip-flop 29-4. As the flip-flop 29-4 is set, the switch 29-6 turns on and thus on/off control signal a is always kept in a state in which a current flows. At this time, about 2.2 mA in total flows.

When a current flows for a predetermined time, the receiver receives an ID which should send a message from the receiving station and thus step S4 judges whether or not the self ID is detected.

When the self ID is not detected (N), the process returns to the step S4, a signal C representing a detection of the ID sets the flip-flop 29-3 and thus turns on the switch 29-5. Thus the control signal e is added to the control unit 25 to operate it, thereby advancing to step S5.

When the data receipt is completed at step S5, the process is changed from the judgment step S6 to the step S7 for turning the display on. When the data receipt is completed, the data receipt completion signal f is added to the flip-flop 29-4 to turn it off, thereby stopping the continuous on operation of the receiver. Further, the data receipt completion signal f is also added to the timer 29-2, thereby turning on the display timer 29-2. When the timer 29-2 turns on, the time counting operation starts, and switch 29-7 turns on. When the flip-flop 29-4 turns off, the on/off control signal turns off, thereby being changed to an intermittent receiving mode.

As the switch 29-7 is off during the operation of the timer 29-2, the control signal g is added to the display unit 26 to operate it, thereby enabling 30 mA to flow through the display unit 26. When the data is being received, a current of 10 mA flows into the control unit 25, and thus total current becomes 12.2 mA. When the display starts, the on/off control signal a turns off and the total current becomes 40.2 mA.

The display period is determined by the time set by the timer 29-2. For example, if the data is transmitted to the pager receiver once a day, a current may flow more than the intermittent receiving time period including the display time. When a predetermined time passes, at the judgment step S8, the timer is completed and the timer 29-2 turns off and switch 29-7 turns off also, thereby stopping the display operation of the display unit g. Then the flip-flop 29-3 is reset and is kept off until a step for the next ID detection.

When the judgment state S8 judges the completion of the timer, an intermittent timer operation step 1 operates as stated above. Therefore the above described operation of the intermittent control 29 decreases the power consumption of the portable receiver.

Figure 16:
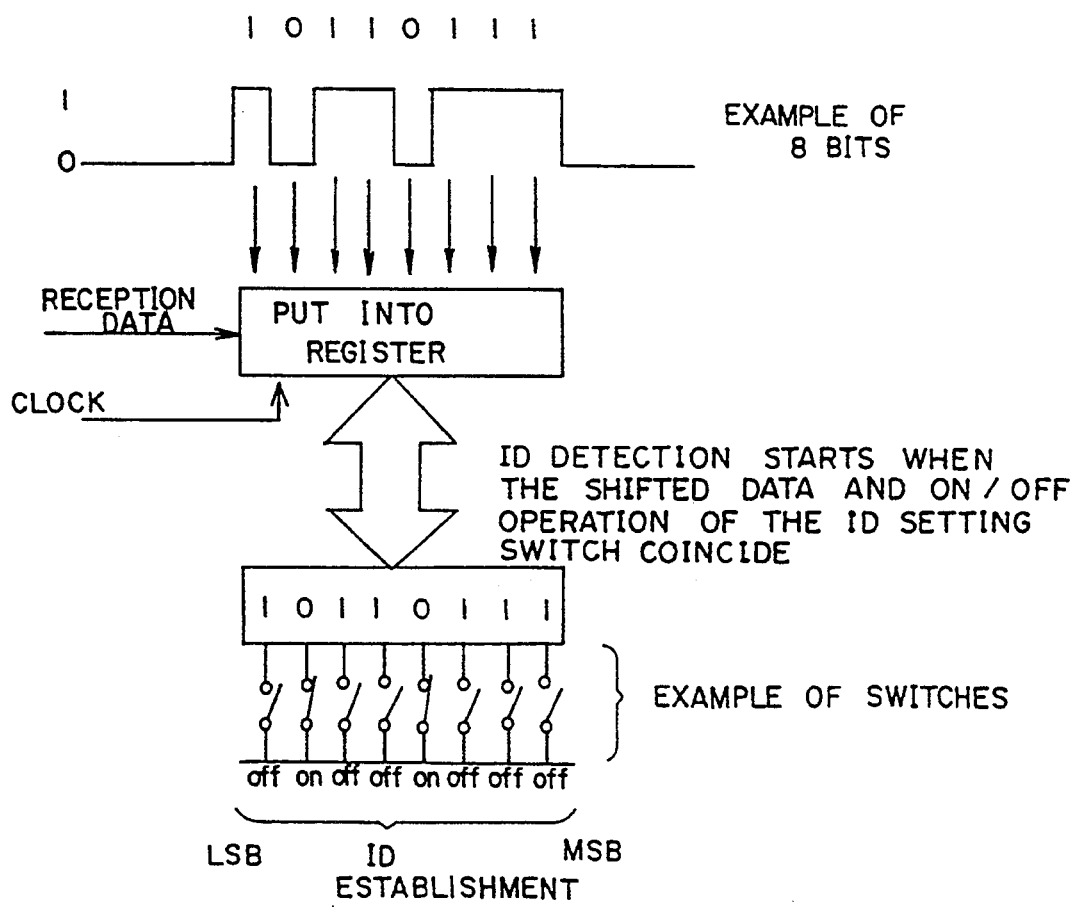
FIG. 16 is an explanatory view of an ID detection.

FIG. 16 shows an explanatory view of the detection in the decoder unit 24-5. A predetermined clock is used for a clock of the shift register. The received data is accepted at the clock and sequentially shifted. When sequentially shifted data coincides with on/off operation of the ID setting switch provided in the portable receiver, the self ID is detected. For example, as shown in FIG. 16, when off is "1" and on is "0", then the input of "11101101" coincides with the setting of the ID, thereby outputting the ID detecting signal.

As described above, according to the radio receiver of the present invention, the oscillation generator for switching a plurality of low frequency signals by a channel designating signal and for outputting it and a dynamic phase shifter for a frequency shifting the output of the local oscillator by performing the rotation of the phase by the output signal of the oscillation generator. Therefore the receiver with a plurality of frequencies can be realized with a simple and small structure and an energy required for the switching can be decreased by the amount of an employment of the low frequency signal. Further, the intermittent receipt control unit energizes the control unit and display unit only when the data addressed to the self station is received, thereby saving the power and maintaining a rising up characteristic for an intermittent reception of the data.

Accordingly, the present invention can use a large capacity of the battery in accordance with the saving of the power.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

What is claimed is,

1. A radio receiver comprising:
    a first oscillator outputting a signal having a frequency;
    a second oscillator for outputting a signal having a lower frequency than the output signal of said first oscillator;
    first mixer means for mixing the output signal from said first oscillator to a signal obtained by shifting the phase of the output signal having the lower frequency of said second oscillator by $\pi/2$ and outputting a signal;
    second mixer means for mixing a signal obtained by shifting the phase of the output signal having the frequency of said first oscillator by $\pi/2$ to the output signal having the lower frequency of said second oscillator and outputting a signal; and
    combining means for combining the output signal of said first mixer means with the output signal of said second mixer means, thereby providing a local oscillator output.

2. The radio receiver according to claim 1, wherein said first and second mixer means comprise a ring modulator.

3. The radio receiver according to claim 1, wherein said radio receiver comprises a pager receiver, said radio receiver further comprising:
    intermittent means for operating said first and second oscillators in an intermittent manner.

4. The radio receiver according to claim 3, further comprising display means for displaying the output signals of said first and second oscillators, said intermittent operating means operating said display means when a self ID is received during a receiving operation.

5. The radio receiver according to claim 1, wherein said second oscillator selectively outputs the output signal at a step interval of a frequency required by said combining means.

6. The radio receiver according to claim 1, wherein the radio receiver is portable and is battery operated.

7. The radio receiver according to claim 1, further comprising:
    display means for displaying the output signal from said first oscillator;
    an intermediate/low frequency processing unit for outputting a signal;
    an intermittent receiving control unit, operatively connected to said intermediate low frequency processing unit, for determining whether or not the output signal of said intermediate/low frequency processing unit is addressed to a selected station nd for energizing said intermittent receiving control unit and said display means only when a received signal is addressed to a self station.

8. The radio receiver according to claim 1, further comprising a dynamic phase shifter;
    wherein said combining means comprises two mixers commonly receiving a signal from an antenna and operatively connected to said dynamic phase shifter, a first one of said two mixers mixing an output of said dynamic phase shifter with the received signal, a second one of said two mixers mixing a signal obtained by phase shifting the output of said dynamic phase shifter by $\pi/2$ with the received signal.

9. A radio receiver comprising:
    a first oscillator outputting a signal having a frequency;
    a second oscillator for outputting an output signal having a lower frequency than the frequency of the output signal from said first oscillator;
    a first phase shifter, operatively connected to said first oscillator, for advancing or delaying the output signal of said first oscillator by $\pi/4$ in accordance with the frequency of the output signal of said first oscillator and outputting a first phase shifted signal;
    a second phase shifter, operatively connected to said first oscillator, for delaying or advancing the output signal of said first oscillator by $\pi/4$ and outputting a second phase shifted signal;

a third phase shifter, operatively connected to said second oscillator, for changing the output signal of said second oscillator by $\pi/2$ in accordance with the frequency of the output signal of said second oscillator and outputting a third phase shift signal;

a first mixer, operatively connected to said first phase shifter and said third phase shifter, for adding the first phase shifted signal of said first phase shifter and the third phase shifted signal of said third phase shifter and outputting a first mixed signal;

a second mixer, operativley connected to a second phase shifter and said second oscillator, for adding the second phase shifted signal of said second phase shifter to the output signal of said second oscillator and outputting a second mixed signal; and combining means, operatively connected to said first mixer and said second mixer, for combining the first mixed signal with the second mixed signal to provide a local oscillation output.

10. A radio receiver according to claim 9, wherein said first phase shifter comprises a circuit comprising a resistor and one of an inductor and capacitor.

* * * * *

UNITED STATES PATENT AND TRADEMARK OFFICE
CERTIFICATE OF CORRECTION

PATENT NO. : 5,369,790

DATED : November 29, 1994

INVENTOR(S) : Yasuhiro Yokota

It is certified that error appears in the above-identified patent and that said Letters Patent is hereby corrected as shown below:

```
     Col. 1, line 3, delete "THE";
          line 27, delete ".";
          line 41, delete "is"; and insert --as--.
          line 65, change ". The" to --the--.
     Col. 2, line 24, before "diode" insert --a--;
          line 33, delete "A", and after "OF" insert --THE--;

line 54, delete "a";
          line 64, change "synthesize" to --synthesizer--.
     Col. 3, line 28, after "THE" insert --PREFERRED--.
     Col. 4, line 7, after "range" delete the space;
          line 25, change "77" to --71--; and
          line 28, change "77" to --71--.
     Col. 5, line 1, change "signal" to --signals--, and
delete ",";
          line 2, change "follow;" to --follows:--;
          line 28, change "Trs" to --$T_{rs}$--;
          line 59, before "to" insert --,--;

line 65, delete space before ",".
     Col. 6, line 2, change "phase" to --phases--.(second occurrence
     Col. 7, line 14, delete the "." before "the".
     Col. 8, line 1, change "29" to --29-1 for--; and
          line 9, delete ".", and change "," to --.--.
     Col. 9, line 18, after "the" insert --ID--.
```

UNITED STATES PATENT AND TRADEMARK OFFICE
CERTIFICATE OF CORRECTION

PATENT NO. : 5,369,790
DATED : November 29, 1994
INVENTOR(S) : Yasuhiro Yokota

It is certified that error appears in the above-indentified patent and that said Letters Patent is hereby corrected as shown below:

Col. 10, line 39, change "nd" to --and--.

Signed and Sealed this

Second Day of May, 1995

Attest:

BRUCE LEHMAN

Attesting Officer     Commissioner of Patents and Trademarks